US005322803A

United States Patent [19]

Cappelletti et al.

[11] Patent Number: 5,322,803

[45] Date of Patent: Jun. 21, 1994

[54] PROCESS FOR THE MANUFACTURE OF A COMPONENT TO LIMIT THE PROGRAMMING VOLTAGE AND TO STABILIZE THE VOLTAGE INCORPORATED IN AN ELECTRIC DEVICE WITH EEPROM MEMORY CELLS

[75] Inventors: Paolo Cappelletti, Seveso; Giuseppe Corda, Saronno; Paolo Ghezzi, Rivolta D'Adda; Carlo Riva, Monza; Bruno Vajana, Bergamo, all of Italy

[73] Assignee: SGS-Thomson Microelelctronics s.r.l., Agrate Brianza, Italy

[21] Appl. No.: 946,797

[22] Filed: Sep. 18, 1992

Related U.S. Application Data

[63] Continuation of Ser. No. 604,895, Oct. 30, 1990, abandoned.

[30] Foreign Application Priority Data

Oct. 31, 1989 [IT] Italy .............................. 22228 A/89

[51] Int. Cl.[5] .......................................... H01L 21/266

[52] U.S. Cl. ........................................ 437/27; 437/28; 437/43; 148/DIG. 174

[58] Field of Search ..................... 437/27, 28, 30, 911, 437/43; 148/DIG. 174

[56] References Cited

U.S. PATENT DOCUMENTS

| | | | |
|---|---|---|---|
| 3,595,714 | 7/1971 | Thiré et al. | 437/911 |
| 4,168,999 | 9/1979 | Vora et al. | 437/150 |
| 4,553,314 | 11/1985 | Chan et al. | 437/43 |
| 4,626,882 | 12/1986 | Cottrell et al. | 357/13 |
| 4,982,371 | 1/1991 | Bolan et al. | 365/228 |
| 5,089,443 | 2/1992 | Anand et al. | 437/43 |

FOREIGN PATENT DOCUMENTS

| | | | |
|---|---|---|---|
| 0055182 | 6/1982 | European Pat. Off. | 437/48 |
| 0320217 | 6/1989 | European Pat. Off. | 437/43 |
| 63-100773 | 5/1988 | Japan | 437/52 |

OTHER PUBLICATIONS

Muller, Device electronic for integrated circuits second edition, John Willey Sons (1986), N.Y., p. 80.

*Primary Examiner*—George Fourson

*Attorney, Agent, or Firm*—Sixbey, Friedman, Leedom & Ferguson

[57] ABSTRACT

The manufacturing process comprises a first step of formation of an N type sink on a single-crystal silicon substrate, a second step of formation of an active area on the surface of said sink, a third step of implantation of N− dopant in a surface region of the sink inside said active area, a fourth step of growth of a layer of gate oxide over said region with N− dopant, a fifth step of N+ implantation inside said N− region, a sixth step of P+ implantation in a laterally displaced position with respect to said N+ region and a seventh step of formation of external contacts for said N+ and P+ regions. There is thus obtained a zener diode limiter, having a cut-off voltage which is stable over time and not much dependent on temperature and which does not require the addition of process steps with respect to those usually necessary for the accomplishment of EEPROM memory cells.

4 Claims, 4 Drawing Sheets

PROCESS FOR THE MANUFACTURE OF A COMPONENT TO LIMIT THE PROGRAMMING VOLTAGE AND TO STABILIZE THE VOLTAGE INCORPORATED IN AN ELECTRIC DEVICE WITH EEPROM MEMORY CELLS

This application is a continuation of Ser. No. 07/605,895, filed Oct. 30, 1990, now abandoned.

DESCRIPTION

The present invention relates to a process for the manufacture of a component to Limit the programming voltage and to stabilise the voltage incorporated in an electric device with EEPROM memory cells.

Such memory cells, electrically erasable, are accomplished with integrated technology, together with N channel and P channel transistors of the corresponding control circuitry, by successive process steps.

A first step provides for the definition of active areas superimposed over a P type substrate, those related to P type transistors being provided with N type sinks.

In a second step there are executed the implant of N− condensers and the definition of thin oxide areas inside the active areas of the EEPROM cells.

A third step provides for the deposition of gate polysilicon both for the EEPROM cells and for the transistors and a fourth step provides for the N+implantation of source and drain in the areas related to the EEPROM cells and to the N channel transistors.

A fifth step also provides for the reoxidation of source and drain related to the EEPROM cells and a sixth step lastly provides for the P+ implantation of source and drain in the areas related to the P channel transistors.

In the EEPROM cells thus accomplished the voltage necessary for programming the cells is usually generated internally by a voltage generator (voltage booster).

The voltage generator can in general generate a voltage which is considerably higher than that necessary for the correct operation of the memory cells and such overvoltage is in contrast with the need of supplying the individual cell with a stable programming voltage independently of variations of process and operativeness.

To overcome this drawback voltage limiters are generally used constituted by small transistor chains (both N and P channel) in a diode connection, field transistors again in a diode connection, reverse biased N (P) diodes on substrate.

The use as limiters of small transistor chains in a diode connection implies a heavy dependence of the cut-off voltage on process variations and on operating temperatures.

The use of diodes allows the use of a cut-off voltage which is not much dependent on the operating temperature of the device and on process variations but which diminishes over time.

The concept is also known of using zener diodes as Limiters which have the advantage of having a cut-off voltage which is stable over time and not much dependent on temperature.

One problem connected with the use of zener diode limiters is, however, constituted by the need not to complicate too much the manufacturing process of the MOS device with which the limiters are associated.

The object of the present invention is to accomplish a process for the manufacture of a component to Limit the programming voltage and to stabilise the voltage with a cut-off voltage stable over time and not much dependent on temperature, which may be associated with an MOS device having EEPROM memory cells, which does not complicate or lengthen the time of the usual process for the accomplishment of memory cells.

According to the invention such object is attained with a process for the manufacture of a component to Limit the programming voltage and to stabilise the voltage, characterized in that it comprises a first step of formation of an N type sink on a single-crystal silicon substrate, a second step of formation of an active area on the surface of said sink, a third step of implantation of N− dopant in a surface region of the sink inside said active area, a fourth step of growth of a Layer of gate oxide over said region with N− dopant, a fifth step of N+ implantation inside said N− region, a sixth step of P+ implantation in a laterally displaced position with respect to said N+ region and a seventh step of formation of external contacts for said N+ and P+ regions.

A process of this kind, from which there originates a zener diode limiter with breakdown areas accomplished in depth between the N+ and P+ regions, and which thus has a cut-off voltage which is stable over time and not much dependent on temperature, is perfectly integrated in the manufacturing process of an EEPROM memory cell and in the associated control circuitry, since each of the above process steps may be executed simultaneously with a corresponding step of the manufacturing process of the EEPROM cells and of its related transistors. In particular the step for the accomplishment of sink N may be combined with that for the accomplishment Of the similar sinks of P channel transistors, the step of implantation of the N− dopant is equivalent to the step of implantation of condensers of the EEPROM cells, the N+ implantation step is the same as the step of N+ implantation of source and drain in the areas corresponding to the EEPROM cells and to the N channel transistors and the P+ implantation step of source and drain in the areas corresponding to the P channel transistors.

Since no process steps are added, the accomplishment of the programming voltage Limiter, which may also be used as a stabiliser of the power supply voltage of the MOS device, is obviously simple and has a Low cost and may be integrated perfectly with the usual problems and manufacturing standards of EEPROM cells and related circuitry.

The features of the present invention shall be made more evident by the following detailed description of embodiments illustrated as a non-Limiting example in the enclosed drawings, wherein:

BRIEF DESCRIPTION OF THE DRAWINGS

With reference to FIGS. 1 to 7, a first step illustrated in FIG. 1 provides for the creation of a sink 2 of type N inside a substrate 1 of single-crystal silicon with a P type doping.

Figure 1:
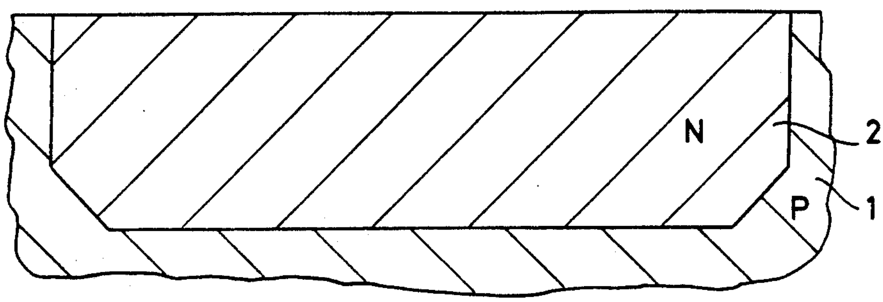
FIGS. 1 to 7 illustrate a succession of process steps for the accomplishment of a limiter component according to the present invention.
Figure 2:
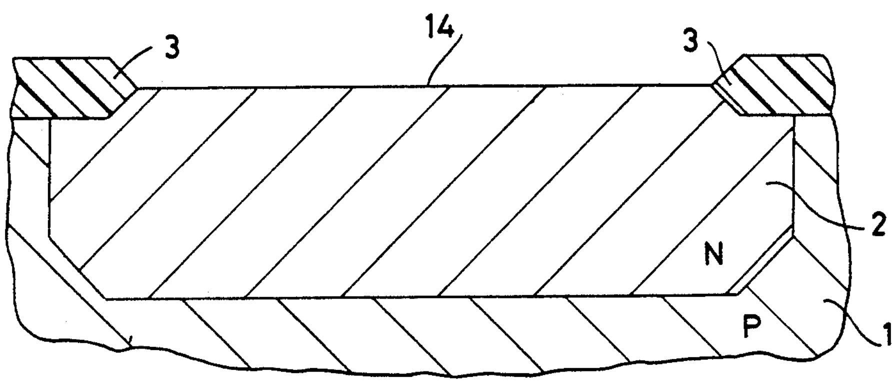

A second step, illustrated in FIG. 2, provides for the creation of two field oxide regions 3 for the definition of an active area 14 included between them.

Figure 3:
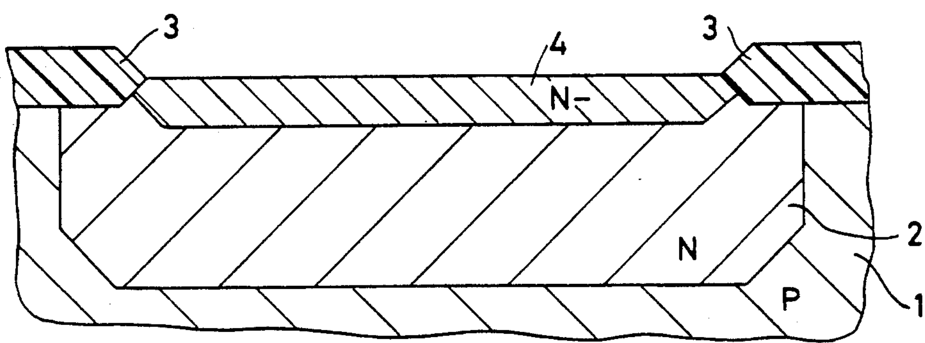

A third step, illustrated in FIG. 3, provides for the implantation of N− dopant in a surface region 4 of sink 2, exploiting the similar implant of condensers (phosphorus with a dose of some $1E14 = 10^{14}$ atoms/cm$^2$) of the EEPROM cells.

Figure 4:
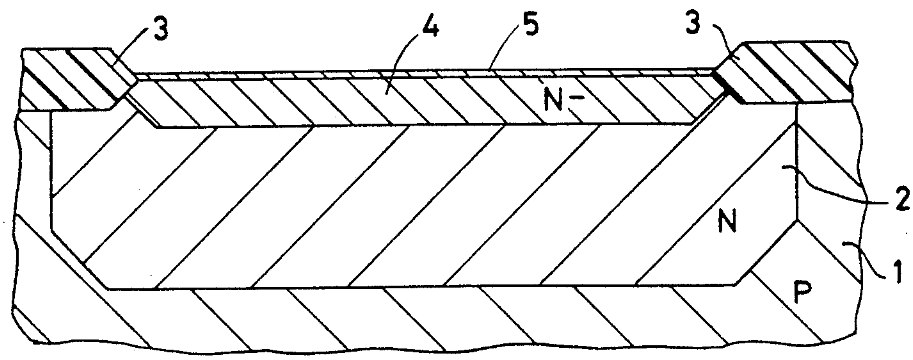

A fourth step, illustrated in FIG. 4, provides for the growth of a gate oxide layer over region 4.

Figure 5:
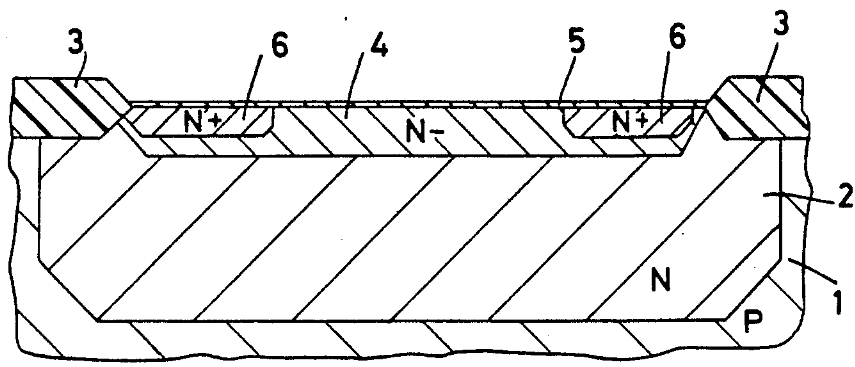

A fifth step, illustrated in FIG. 5, provides for the N+ implantation in an annular region 6 after a masking operation. The implant is the same as the source and drain regions of the EEPROM cells (arsenic with a dose of some $1E15 = 10^{15}$ atoms/cm$^2$).

Figure 6:
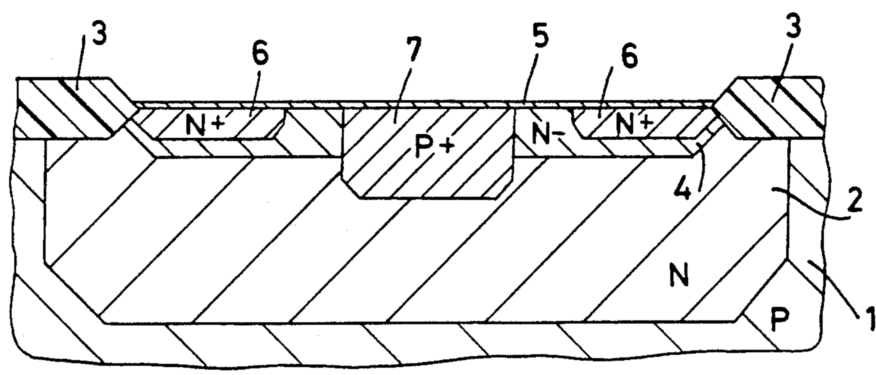

A sixth step, illustrated in FIG. 6, provides, again after a masking operation, for the P+ implantation in a central region 7, using the same source and drain implant of the P channel transistors (boron with a dose of some 1E15).

The above masks are chosen so as to maintain a distance between regions 6 and 7 equal to the sum of the alignment tolerances of the P+ and N+ source and drain masks plus the sum of the lateral diffusions of the corresponding P+ and N+ implants. In addition, the P+ mask must be further back with respect to the edge of the active area, so as to allow, as described immediately below, the formation of the sink's biasing contacts well away from the P+ type area 7.

Figure 7:
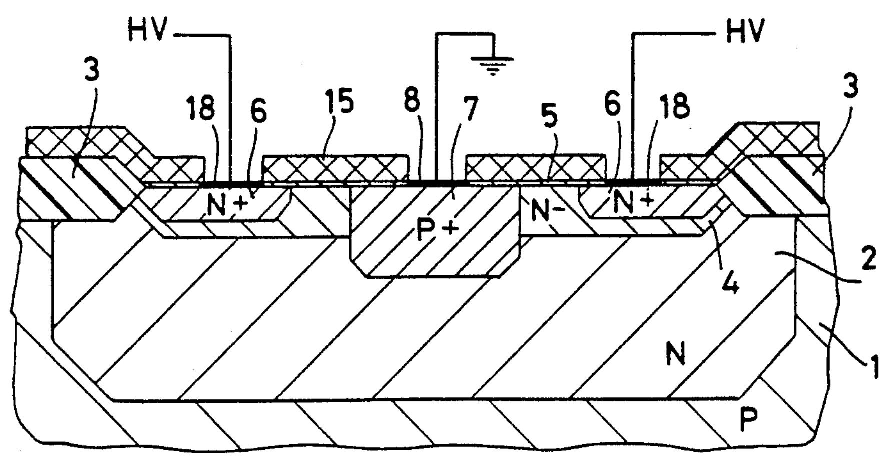

A seventh step, illustrated in FIG. 7, provides for the conventional formation of contacts 8, 16, connected to ground and to the HV power supply of the MOS device. A dielectric 15 is superimposed over the entire component, except for the above contacts.

Figure 8:
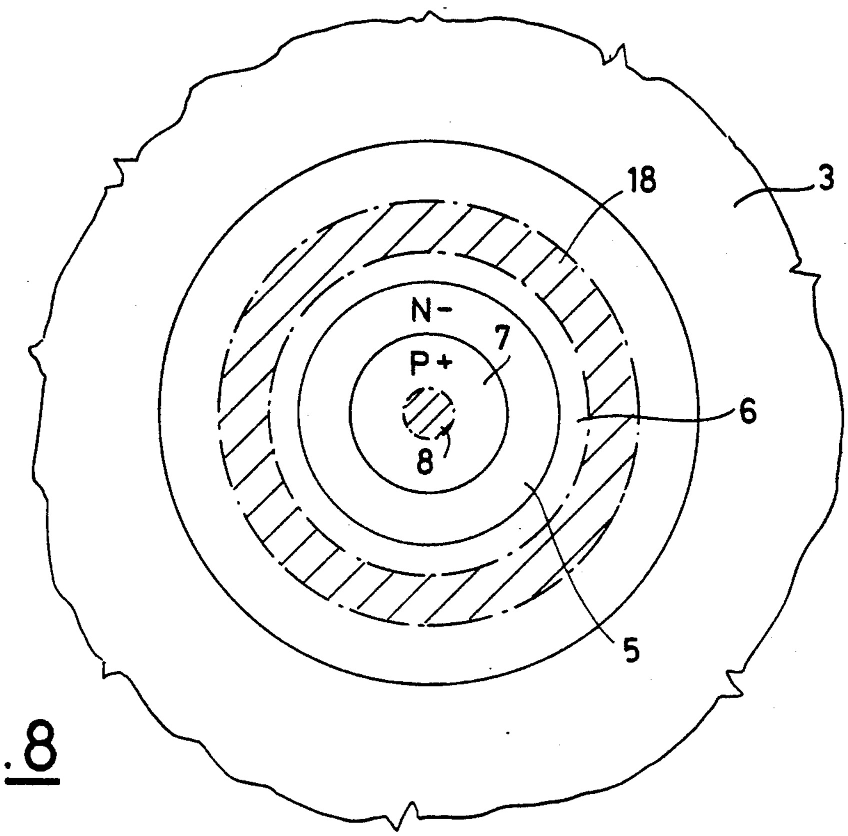
FIG. 8 illustrates a top plan view of the limiter component illustrated in FIGS. 1 to 7, accomplished at the level of the substrate surface.

There is thus obtained the zener diode limiter illustrated in FIGS. 7 and 8, which, having the breakdown areas between regions 4 and 7 well away from the oxide areas 3, has a cut-off voltage which is stable over time and not much dependent on temperature.

With reference to FIGS. 9 to 12 an alternative process provides for four steps similar to those already described according to the previous process in FIGS. 1 to 4. A fifth step, illustrated in FIG. 9, successively provides for the deposition, the N+ doping and the definition of a polysilicon Layer 11, which has a part 11' superimposed over a central part of region 4 and at a suitable distance from the field oxide 3 so as to allow, as shall be seen later, the opening of biasing contacts of sink 2. In addition, the polysilicon Layer 11 must be sufficiently wide, considering the alignment tolerances of the N+ and P+ source and drain masks, to allow the opening of such masks on it without overflows.

Figure 10:
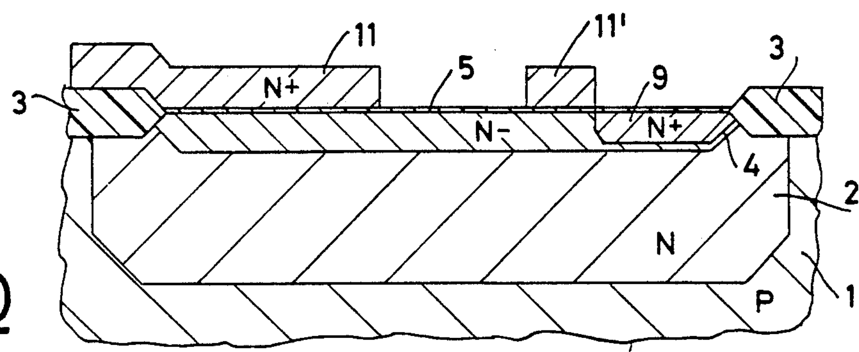

With reference to FIG. 10, a sixth step provides after masking an N+ implantation in a region 9 between the part of polysilicon 11' and the adjacent field oxide 3. The implant is the same as the source and drain regions of the EEPROM cells.

Figure 11:
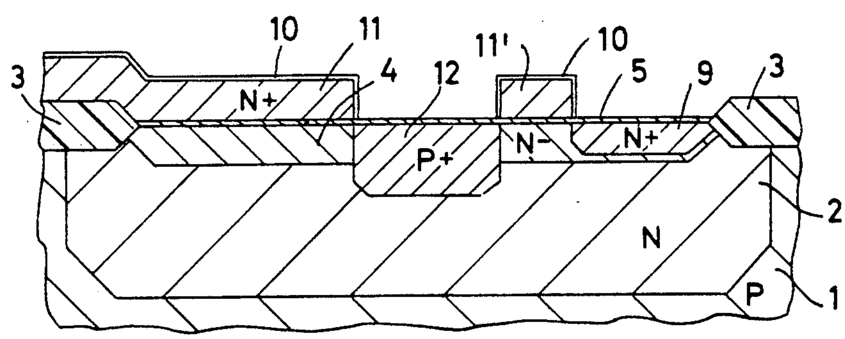

With reference to FIG. 11, a seventh step provides for a reoxidation of source and drain 10 of polysilicon 11, 11' and then after masking a P+ implantation in a central region 12 between the polysilicon strip 11 and its part 11'.

Figure 12:
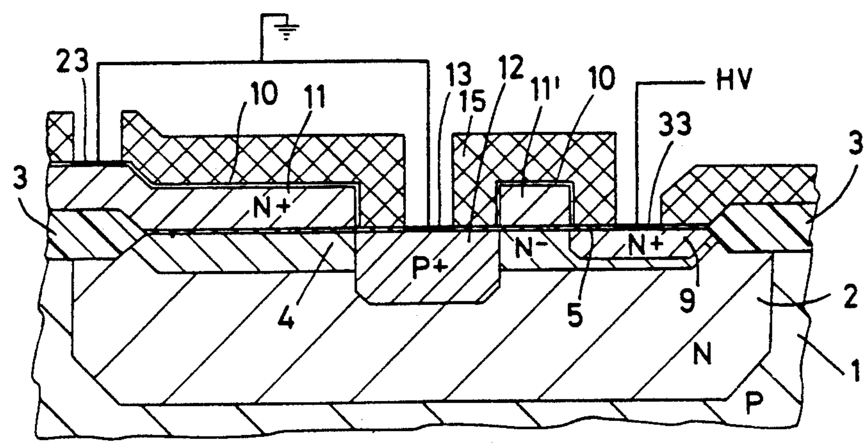

With reference to FIG. 12, an eighth step provides for the creation of metal contacts 13, 23, 33, for the connection to ground of the P+ region 12 and of the polysilicon 11 and for the connection to the HV power supply of the N+ region 9, respectively. There is also superimposed a dielectric 15.

Figure 13:
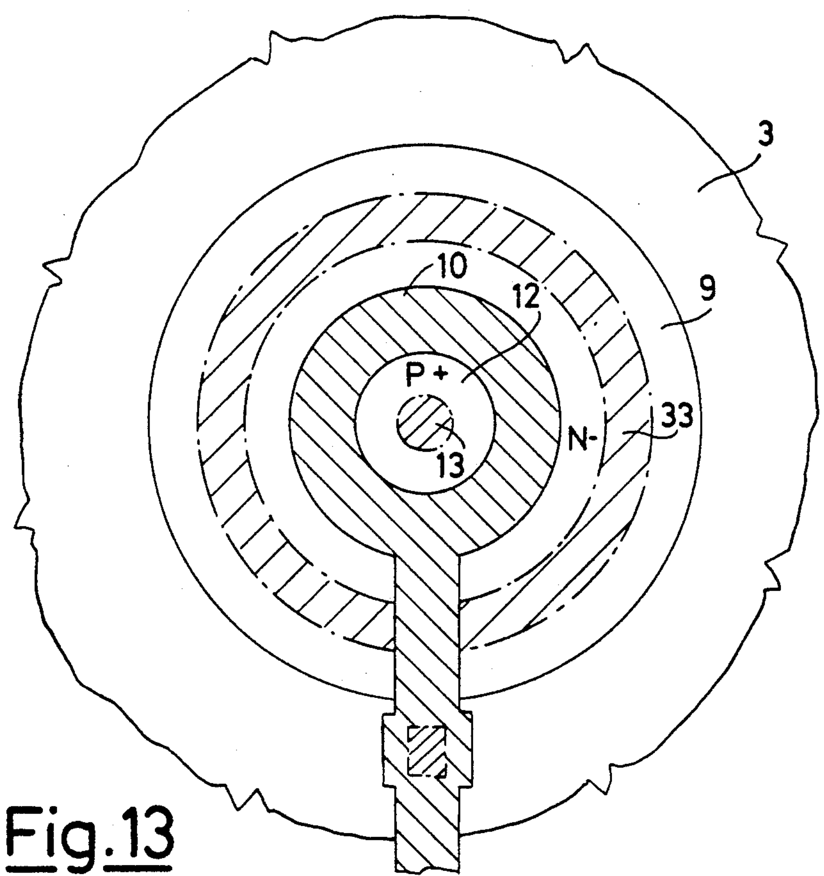
FIG. 13 illustrates a top plan view of the limiter component illustrated in FIGS. 9 to 12.
Figure 9:
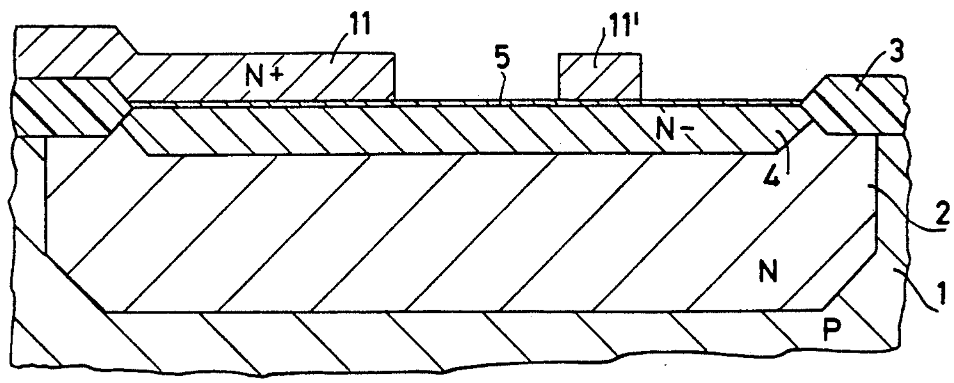
FIGS. 9 to 12 illustrate an alternative succession of process steps for the accomplishment of another limiter component according to the present invention.

There is thus obtained the zener diode limiter illustrated in FIGS. 12 and 13, which maintains the features of that of FIGS. 7 and 8 but is an improvemt on them, in terms of performance, because the polysilicon Layer 11", shortcircuited with the P+ region 12, relaxes the superficial electric field, thus causing the breakdown to occur at a greater depth, improving stability.

It must be considered that, with the doses indicated earlier, the limiter, in both versions, has a breakdown voltage between sink 2 and the P+ region of about 5 volts. Three of these limitors connected in series thus allow a cut-off voltage of some 15 volts at 25° C., and in any case their combination with diode-connected transistors allows the fine definition of the desired trigger voltage.

The same component, of a suitable size, can on the other hand also be used as a voltage stabiliser and as input protection for the MOS device with EEPROM cells.

We claim:

1. A process for the manufacture of a programming voltage limiting and voltage stabilizing component, comprising the following steps:

(a) forming an N type sink on a single-crystal silicon substrate;
(b) forming an active area on the surface of said sink;
(c) implanting N− dopant in an N− region on the surface of the sink inside said active area;
(d) growing a gate oxide layer on said active area;
(e) depositing a layer of N+ polysilicon having one part superimposed over a lateral portion of said N− region and another part superimposed to a further portion of said N− region in intermediate position between said lateral portion and an opposite lateral portion of said N− region;
(f) implanting N+ dopant in an uncovered region of said N− region underlying said opposite lateral portion of the N− region;
(g) implanting P+ dopant in a further uncovered region of said N− region between said parts of the polysilicon layer; and
(h) forming external contacts connected respectively to said N+ and P+ regions.

2. The process of claim 1 comprising the further step of reoxidation of said N+ polysilicon layer after the deposition thereof.

3. A process for the manufacture of a programming voltage limiting and voltage stabilizing component, comprising the following steps:

(a) forming an N type sink on a single-crystal silicon substrate;
(b) forming an active area on the surface of said N type sink;
(c) implanting N− dopant in an N− region on the surface of said sink inside said active area;
(d) growing a gate oxide layer on said active area;
(e) implanting N+ dopant in an annular region of said N− doped surface region;
(f) implanting P+ dopant in a central region of said N− surface region, said P+ region penetrating said N− region and surrounded by said N+ doped annular region; and
(g) forming external contacts through said gate oxide layer for said N+ and P+ doped regions.

4. The proces of claim 3 including the step of forming a Zener diode by said implantation of said P+ dopant in said central region where the Zener diode comprises said central region and said annular region.

* * * * *

UNITED STATES PATENT AND TRADEMARK OFFICE
CERTIFICATE OF CORRECTION

PATENT NO. : 5,322,803

DATED : June 21, 1994

INVENTOR(S) : Paolo CAPPELLETTI, Giuseppe CORDA, Paolo GHEZZI, Carlo RIVA, Bruno VAJANA It is certified that error appears in the above-identified patent and that said Letters Patent is hereby corrected as shown below:

On the title page, item
[73] Assignee: SGS-Thomson Microelectronics s.r.l., Agrate Brianza, Italy Signed and Sealed this Tenth Day of January, 1995

Attest:

BRUCE LEHMAN

Attesting Officer

*Commissioner of Patents and Trademarks*